(12) United States Patent
Satsu et al.

(10) Patent No.: US 6,638,352 B2
(45) Date of Patent: Oct. 28, 2003

(54) THERMAL STABLE LOW ELASTIC MODULUS MATERIAL AND DEVICE USING THE SAME

(75) Inventors: Yuichi Satsu, Hitachi (JP); Morimichi Umino, Hitachiota (JP); Takumi Ueno, Mito (JP); Akio Takahashi, Hitachiota (JP); Akira Nagai, Hitachi (JP); Toshiya Satoh, Kanasagou (JP); Shinji Yamada, Tsukuba (JP); Kazuhiro Suzuki, Mito (JP)

(73) Assignee: Hitachi, Ltd., Tokyo (JP)

( * ) Notice: Subject to any disclaimer, the term of this patent is extended or adjusted under 35 U.S.C. 154(b) by 5 days.

(21) Appl. No.: 10/097,664

(22) Filed: Mar. 15, 2002

(65) Prior Publication Data

US 2003/0049193 A1 Mar. 13, 2003

(30) Foreign Application Priority Data

Jul. 10, 2001 (JP) ........................................ 2001-208672

(51) Int. Cl.$^7$ ........................ C08L 83/00; C08G 77/452
(52) U.S. Cl. .................... 106/287.11; 525/431; 528/26; 528/23; 528/38
(58) Field of Search ............................ 525/431; 528/26, 528/28, 38; 106/287.11

(56) References Cited

U.S. PATENT DOCUMENTS

| | | | |
|---|---|---|---|
| 4,604,443 A | * | 8/1986 | Chang et al. .................. 528/28 |
| 4,758,476 A | * | 7/1988 | Sekine et al. ............. 428/473.5 |
| 5,036,145 A | * | 7/1991 | Echterling et al. .......... 525/431 |
| 6,005,060 A | | 12/1999 | Murata et al. |
| 6,011,123 A | * | 1/2000 | Kurosawa et al. .......... 525/431 |
| 6,225,418 B1 | | 5/2001 | Satsu et al. |

FOREIGN PATENT DOCUMENTS

| | | |
|---|---|---|
| JP | 7-331069 | 12/1995 |
| JP | 7-331070 | 12/1995 |
| JP | 8-100107 | 4/1996 |
| JP | 10-107172 | 4/1998 |
| JP | 10-245490 | 9/1998 |
| JP | 11-17346 | 1/1999 |
| JP | 2000-109709 | 4/2000 |

* cited by examiner

Primary Examiner—Robert Dawson
Assistant Examiner—Marc S. Zimmer
(74) Attorney, Agent, or Firm—Antonelli, Terry, Stout & Kraus, LLP

(57) ABSTRACT

The present invention provides a thermal stable low elastic modulus material, which has high thermal stability, is little in change in dynamic characteristics such as coefficient of thermal expansion and elastic modulus within a temperature of −50° C. to 300° C., has an elastic modulus at room temperature of 2–0.01 GPa and is high in reliability of electric insulation regardless of a temperature fluctuation, and provides a semiconductor device using the same.

The present invention also provides a thermal stable low elastic modulus resin composition obtained by heat-curing a mixture containing a polyimide, polyamide-imide or polyamide resin or resin precursor, whose cured product has an elastic modulus measured at −50° C. of 2–0.01 GPa, and an oligomer of an organosilicon compound having a functional group capable of causing addition reaction with an NH and/or COOH group.

6 Claims, 3 Drawing Sheets

FIG. 1

1. FORMATION OF STRESS RELAXING LAYER
   FILM FORMATION OF THERMAL STABLE LOW ELASTIC
   MATERIAL IN ACCORDANCE WITH THE PRESENT INVENTION
   FORMATION OF BLIND VIA HALL
   BY CARBON DIOXIDE GAS LASER

2. FORMATION OF CONDUCTOR LAYER
   COPPER PLATING
   ELECTRODEPOSITION RESIST
   PATTERNING
   (LIGHT EXPOSURE, DEVELOPING, ETCHING)
   PEELING OF RESIST

3. ENCAPSULATION
   SCREEN-PRINTING

4. FORMATION OF BUMP
   TRANSFER OF SOLDER BALL, REFLOW

5. CUTTING INTO SQUARES

6. ELECTRIC CONNECTION WITH CIRCUIT BOARD
   REFLOW CONNECTION

FIG. 2

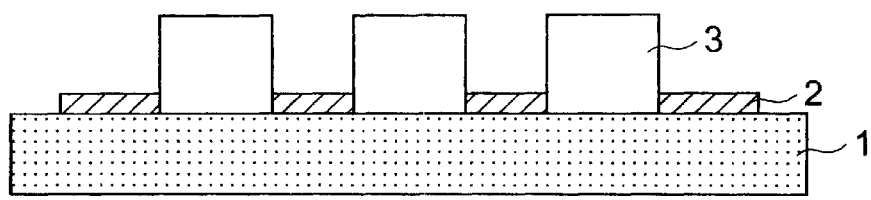

THERMAL STABLE LOW ELASTIC MODULUS MATERIAL AND DEVICE USING THE SAME

FIELD OF THE INVENTION

The present invention relates to a thermal stable low elastic modulus material capable of relaxing a stress generated between bare chip and bare chip, bare chip and metal material, bare chip and organic material, bare chip and inorganic material, metal material and organic material, metal material and inorganic material, and organic material and inorganic material in semiconductor fields.

BACKGROUND OF THE INVENTION

In electrically connecting a bare chip with a thin film multi-layered circuit formed on a printed circuit board, a thin film multi-layered circuit board, a ceramic circuit board or a metal board through a solder ball, that is, in the so-called flip chip packaging, there is left the following problem.

There is a difference in a coefficient of thermal expansion between the bare chip and the printed circuit board, thin film multi-layered circuit board, ceramic circuit board or metal board. For that reason, the stress concentrates on a solder ball and a fatigue fracture of the solder ball easily occurs at the time of a thermal cycle test during or after the production process.

As one of means for solving said problem, a space between the bare chip and the circuit board after completion of the flip chip packaging is filled with a resin referred to as under-fill, thereby increasing reliability of the electric connection between the bare chip and the circuit board. This is considered to be an effect of under-fill to distribute the stress concentrated on the solder ball.

As another means for solving the problem, JP-A-11-17346 discloses a process comprising using a printed board prepared by using an elastomer material, thereby relaxing the stress concentrated on the solder ball after completion of the flip chip packaging. Furthermore, JP-A-10-107172 also discloses a process comprising using an elastomer as an adhesive applied between the bare chip and the solder ball, thereby reducing the stress loading on the solder ball.

It is a trend that a packaging density becomes higher, a chip size increases much more and the solder ball becomes smaller along with the miniaturization of electronic instruments. In addition, the existing elastomer has a glass transition temperature (Tg), at which a low temperature region and a high temperature region are separated from each other, and therefore it becomes difficult to ensure reliability. The reason why it becomes difficult to ensure reliability is considered as follows. At the low temperature region below the Tg, elasticity of the elastomer material becomes high, thereby increasing the stress concentration on the solder ball, and as a result, the solder ball easily produces cracks. Whereas, above the Tg, deformation of the elastomer becomes large, thereby deteriorating an adhesion strength and an electric insulation.

As materials of little change in their physical properties above or below the Tg, JP-A-8-100107 and JP-A-2000-109709 disclose an epoxy resin material, and JP-A-7-331069 and JP-A-7-331070 disclose a polyamide-amide resin material. However, these materials are all high elasticity materials and therefore cannot be used as a low elastic modulus material for stress relaxation use.

SUMMARY OF THE INVENTION

In prior arts, those obtained by incorporating a rubber component in a thermosetting resin and those obtained by introducing a siloxane as a low elastic modulus component in a polymer have been used as a low elastic modulus material. However, these materials are those having a Tg within a range of from room temperature to 200° C. In the case of a temperature higher than 200° C. in comparison with the case of room temperature, decrease in the elastic modulus becomes not less than two figures, and increase of coefficient of linear expansion becomes several times, and as a result, adhesion strength and electric insulation greatly deteriorate. Further, those obtained by incorporating a rubber component in a thermosetting resin have a Tg within a range of from room temperature to −50° C. owing to the rubber component. Thus, below the Tg, elasticity of the rubber component is increased with increase in the stress between the bare chip and the circuit board. As a result, it is a trend that a size of the bare chip is increased with increase of peel of the bare chip from the circuit board to cause deteroration in electric insulation between the bare chip and the circuit board after completion of the flip chip packaging.

An object of the present invention is to provide a thermal stable low elastic modulus material, which is possessed of thermal stability of not less than 300° C., capable of relaxing the stress between bare chip and bare chip, bare chip and metal material, bare chip and organic material, bare chip and inorganic material, metal material and organic material, metal material and inorganic material, and organic material and inorganic material in semiconductor fields, and high in electric reliability.

In order to accomplish the above-mentioned object, it is important to diminish change in physical properties of a low elastic modulus material, which change occurs above and below a Tg within a range of from −50° C. to 300° C. That is, it is important that an elastic modulus measured at −50° C. of a low elastic modulus material is from 2 GPa to 0.01 GPa and an elastic modulus thereof measured at 300° C. is not less than one fiftieth time that measured at −50° C., a coefficient of thermal expansion thereof measured in the vicinity of −50° C. is not less than 0.5 time that measured in the vicinity of 300° C., and difference between an electric insulation thereof measured at 25° C. and that measured at 200° C. is less than three figures.

It is considered that in order to diminish the change in physical properties of a resin owing to a temperature fluctuation, it is important to incorporate a substance at the level of molecule, which substance is little in change in physical properties owing to a temperature fluctuation. The present invention is concerned with a technique, according to which an $SiO_2$ skeleton, which is stable from a viewpoint of dynamic characteristics, and which is little in change in physical properties owing to a temperature fluctuation, is uniformly produced at the level of molecule, and a functional group capable of forming a covalent bond with a resin is imparted at the end of the $SiO_2$ skeleton, so that it can be bonded with a resin, and thereby change of the resin owing to a temperature fluctuation can be diminished.

The present invention is summarized to contain a resin or resin precursor and an organosilicon compound represented by the following general formula 1, 2 or 3, provided that the resin contains at least one resin selected from the group consisting of polyimides, polyamide-imides and polyamides, and an elastic modulus measured at −50° C. of a cured product of the resin is from 2 GPa to 0.01 GPa,

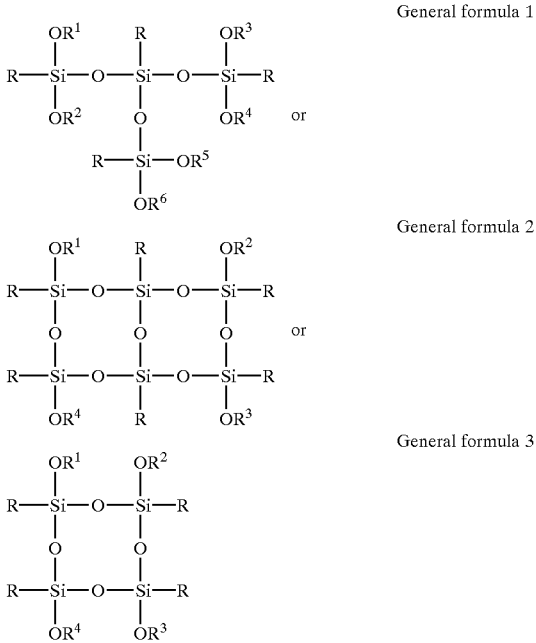

General formula 1

General formula 2

General formula 3 wherein R is a group capable of forming a covalent bond with the polyimide, polyamide-imide or polyamide, and $R^1$ to $R^6$ are independently of one another a silicon-containing group having 0 to 10 repeating units of $SiRO_{3/2}$ provided that when a number of the repeating unit is 0, $R^1$ to $R^6$ are independently of one another H, $CH_3$ or $C_2H_5$.

With respect to a heat-cured resin obtained from a varnish comprising the above-defined resin or resin precursor and the above-defined organosilicon compound, its thermal stability is high, a glass transition point almost disappears, and difference of change in physical properties including elastic modulus and coefficient of thermal expansion within a temperature range of from −50° C. to 300° C. and electric insulation is little. Therefore, even when a size of the bare chip is increased, almost no peel of the bare chip from the circuit board and almost no deterioration in electric insulation between the bare chip and the circuit board can be observed after completion of the flip chip packaging.

When the thermal stable resin composition is cured, an integral value of peaks of from −53 ppm to −72 ppm obtained according to a $^{29}$Si-NMR chemical shift is from 1 to 30 times that of peaks of from −40 ppm to −52 ppm obtained according thereto. From the result, it is demonstrated that the organosilicon compound has an Si—O—Si bond to increase the molecular weight. The thermal stable low elastic modulus material comprises a mixture of a resin varnish and a liquid organosilicon compound, which organic compound is uniformly distributed in the thermal stable low elastic modulus material.

The polyimides, polyamide-imides and polyamides, whose cured product has an elastic modulus of from 2 GPa to 0.01 GPa, are not particularly limited and may be one known in the art.

Other objects, features and advantages of the invention will become apparent from the following description of the embodiments of the invention taken in conjunction with the accompanying drawings.

BRIEF DESCRIPTION OF THE DRAWINGS

FIG. 1 is an embodiment of the production step of a semiconductor device in accordance with the present invention.

FIG. 2 is a sectional view of an example of a pattern of a stress-relaxing layer.

Figure 3:
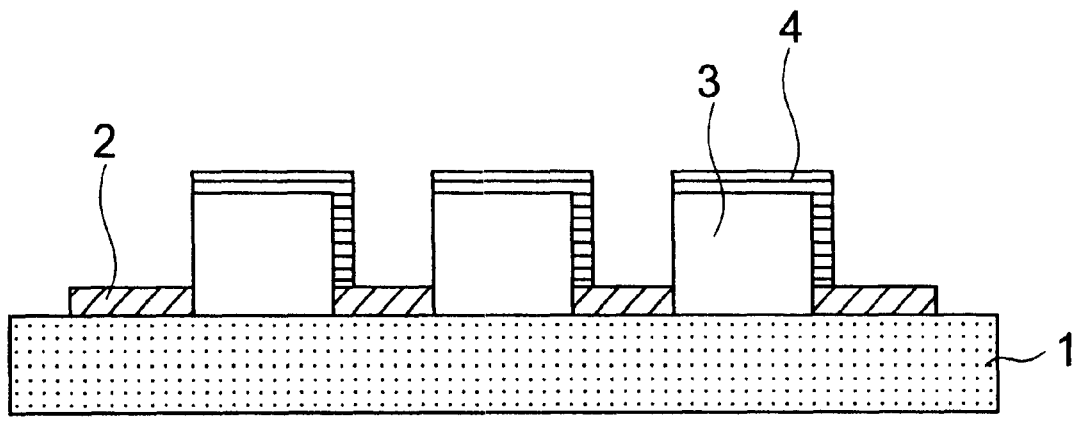
FIG. 3 is a sectional view of that obtained by forming a conductor on that of FIG. 2.

The Figures comprise a semiconductor wafer 1, a pad 2, a stress relaxing layer 3, a conductor 4, an encapsulating resin 5, a solder ball 6 and a circuit board 7.

DETAILED DESCRIPTION OF THE INVENTION

The above-mentioned known polyimide used in the present invention can be obtained by subjecting at least one acid dianhydride or its derivative, a diamine or its derivative and a polydimethylsiloxane to reaction with one another, and subjecting the obtained polyamide acid or its derivative to thermal or chemical ring closure.

Examples of components of the acid anhydride are tetracarboxylic acid anhydrides such as butane-tetracarboxylic acid anhydride, pyromellitic acid anhydride, benzophenone-tetracarboxylic acid anhydride, diphenylsulfone-tetracarboxylic acid anhydride, diphenyl ether-tetracarboxylic acid anhydride, biphenyl-tetracarboxylic acid anhydride and diphenylpropane-tetracarboxylic acid anhydride. These acid anhydrides are only illustrative and not intended to limit the scope of the present invention, and may be used each alone or in combination of two or more.

Examples of the diamine are hexamethylene-diamine, tetramethylenediamine, 4,4-diaminocyclohexane, 4,4-diaminodicyclohexylmethane, 1,3-bis-(aminomethyl)-cyclohexane, 1,4-bis-(aminomethyl)cyclohexane, p-phenylenediamine, m-phenylenediamine, 4,4-diaminodiphenyl ether, 3,3-diaminocyclohexane, 4,4-diaminodiphenylmethane, 2,4-dimethylmetaphenylenediamine, 5-nitrometaphenylenediamine, 5-nitrometaphenylenediamine, 5-chlorometaphenylenediamine, 4,4-diaminodiphenylhexafluoropropane, 3,3-diaminodiphenylhexafluoropropane, 4,4-diaminodiphenylsulfone, 3,3-diaminodiphenylsulfone, 4,4-diaminodiphenylsulfide, 3,3-diaminodiphenylsulfide, 4,4-diaminobenzophenone, 3,3-diaminobenzophenone, 4,4-diaminobiphenyl and 3,3-diaminobiphenyl. These diamines are only illustrative and not intended to limit the scope of the present invention, and may be used each alone or in combination of two or more.

Examples of the polydimethylsiloxane components are aminopropyl-terminal polymethylsiloxanes having a molecular weight of from about 800 to about 30000, which are only illustrative and not intended to limit the scope of the present invention.

These known polyamide-imide used in the present invention can be obtained by subjecting at least one tricarboxylic acid monoanhydride, a tricarboxylic acid monoanhydride monochloride or a derivative thereof, a diamine or its derivative and a polydimethylsiloxane to reaction with one another, and subjecting the obtained polyamide acid or its derivative to thermal or chemical ring closure.

Examples of the tricarboxylic acid monoanhydride and tricarboxylic acid monoanhydride monochloride components are tricarboxylic acid anhydrides and their chlorides such as butane-tricarboxylic acid anhydride, butane-tricarboxylic acid anhydride monochloride, trimellitic acid anhydride, trimellitic acid anhydride monochloride, benzophenone-tricarboxylic acid anhydride, benzophenone-tricarboxylic acid anhydride monochloride, diphenylsulfone-tricarboxylic acid anhydride, diphenylsulfone-tricarboxylic acid anhydride monochloride, diphenyl ether-tricarboxylic acid anhydride, diphenyl ether-tricarboxylic acid anhydride monochloride, biphenyl-tricarboxylic acid anhydride, biphenyl-tricarboxylic acid anhydride monochloride, diphenylpropane-tricarboxylic acid anhydride, diphenylpropane-tricarboxylic acid anhydride monochloride, diphenylhexafluoropropane-tricarboxylic acid anhydride and diphenylhexafluoropropane-tricarboxylic acid anhydride monochloride. These acid anhydrides and their monochlorides are only illustrative and not intended to limit the scope of the present invention, and may be used each alone or in combination of two or more.

Examples of the amine components are hexamethylenediamine, tetramethylenediamine, 4,4'-diaminocyclohexane, 4,4'-diaminodicyclohexylmethane, 1,3-bis-(aminomethyl)cyclohexane, 1,4-bis-(aminomethyl)cyclohexane, p-phenylenediamine, m-phenylenediamine, 4,4'-diaminodiphenyl ether, 3,3-diaminodicyclohexane, 4,4'-diaminodiphenylmethane, 2,4-dimethylmetaphenylenediamine, 5nitrometaphenylenediamine, 5-nitrometaphenylenediamine, 5-chlorometaphenylenediamine, 4,4'-diaminodiphenylhexafluoropropane, 3,3'-diaminodiphenylhexafluoropropane, 4,4'-diaminodiphenylsulfone, 3,3'-diaminodiphenylsulfone, 4,4'-diaminodiphenylsulfide, 3,3'-diaminodiphenyl-sulfide, 4,4'-diaminobenzophenone, 3,3'-diaminobenzophenone, 4,4'-diaminobiphenyl and 3,3'-diaminobiphenyl. These diamines are only illustrative and not intended to limit the scope of the present invention, and may be used each alone or in combination of two or more.

Examples of the polydimethylsiloxane components are aminopropyl-terminal polymethylsiloxanes having a molecular weight of from about 800 to 30000, which are only illustrative and not intended to limit the scope of the present invention.

These known polyamide used in the present invention can be obtained by subjecting at least one dicarboxylic acid or its derivative, a diamine or its derivative and a polydimethylsiloxane to reaction with one another.

Examples of the dicarboxylic acid components are butane-dicarboxylic acid, terephthalic acid, benzophenone-dicarboxylic acid, diphenylsulfone-dicarboxylic acid, diphenyl ether-dicarboxylic acid, biphenyl-dicarboxylic acid diphenylpropane-dicarboxylic acid and diphenylhexafluoropropane-dicarboxylic acid. These dicarboxylic acids are only illustrative and not intended to limit the scope of the present invention, and may be used each alone or in combination of two or more.

Examples of the amine components are hexamethylenediamine, tetramethylenediamine, 4,4'-diaminocyclohexane, 4,4'-diaminodicyclohexylmethane, 1,3-bis-(aminomethyl)cyclohexane, 1,4-bis-(aminomethyl)cyclohexane, p-phenylenediamine, m-phenylenediamine, 4,4'-diaminodiphenyl ether, 3,3'-diaminocyclohexane, 4,4'-diaminodiphenylmethane, 2,4-dimethylmetaphenylenediamine, 5-nitrometaphenylenediamine, 5-nitrometaphenylenediamine, 5-chlorometaphenylenediamine, 4,4'-diaminodiphenylhexafluoropropane, 3,3'-diaminodiphenylhexafluoropropane, 4,4'-diaminodiphenylsulfone, 3,3'-diaminodiphenylsulfone, 4,4'-diaminodiphenylsulfide, 3,3'-diaminodiphenylsulfide, 4,4'-diaminobenzophenone, 3,3'-diaminobenzophenone, 4,4'-diaminobiphenyl and 3,3'-diaminobiphenyl. These diamines are only illustrative and not intended to limit the scope of the present invention, and may be used each alone or in combination of two or more.

The inventors of the present invention have found the following. That is, it is effective that a mixture of an organosilicon compound represented by a general formula 4,

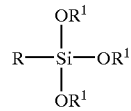

General formula 4 and water is heat-treated in advance and subjected to deaeration in vacuo, and the resulting liquid containing the oligomerized organosilicon compound is added to and uniformly mixed with a polyamic acid, polyamide-imide or polyamide varnish. Here, the organosilicon compound has a functional group capable of causing an addition reaction with at least the NH or COOH group present in the polyamic acid, polyamideimide or polyamide.

As examples of the organosilicon compound represented by the general formula 4, functional group-carrying silane compounds represented by the following chemical formulas 5 to 14 are enumerated.

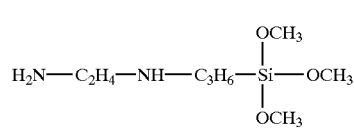

Chemical formula 5

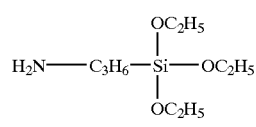

Chemical formula 6

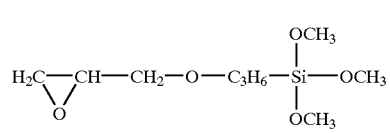

Chemical formula 7

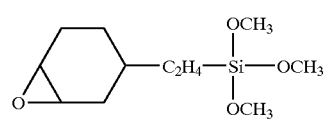

Chemical formula 8

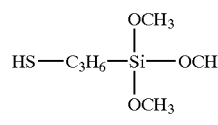

Chemical formula 9

-continued

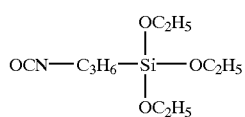
Chemical formula 10

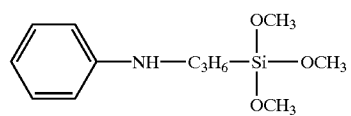
Chemical formula 11

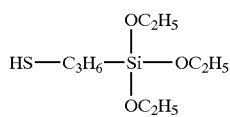
Chemical formula 12

H₂N—C₂H₄—HN—C₂H₄—NH—C₃H₆—Si(OCH₃)₃
Chemical formula 13

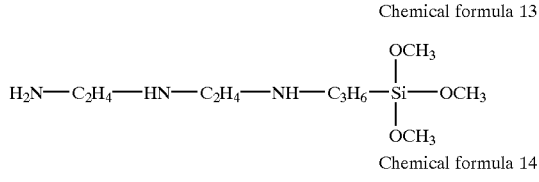
Chemical formula 14

It has been found according to GPC and a ²⁹Si-NMR chemical shift that the organosilicon compound oligomerized in the above-described manner exhibits a high dispersibility in the varnish and moreover causes no hydrolysis reaction of the polyamic acid, polyamide-imide and polyamide.

With respect to a monomer of the organosilicon compound represented by the general formula 4,

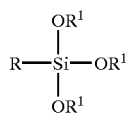
General formula 4 wherein R is an organic group including a functional group capable of causing an addition reaction with at least the NH or COOH group present in the polyamic acid, polyamide-imide or polyamide, and R' is CH₃ or C₂H₅, the ²⁹Si-NMR chemical shift reveals absorption at from −41 ppm to −44 ppm.

With respect to a compound having one —O—Si bond, which is represented by a structural formula 15,

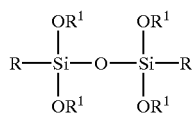
Structural formula 15 the ²⁹Si-NMR chemical shift reveals absorption at from −48 ppm to −52 ppm.

With respect to a compound having two —O—Si bonds, which is represented by a structural formula 16,

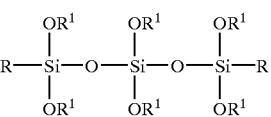
Structural formula 16 the ²⁹Si-NMR chemical shift reveals absorption at from −53 ppm to −63 ppm.

With respect to a compound having three —O—Si bonds, which is represented by a structural formula 17,

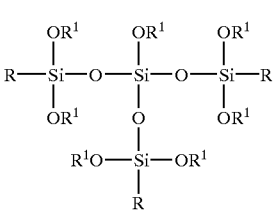
Structural formula 17 the ²⁹Si-NMR chemical shift reveals absorption at from −63 ppm to −72 ppm.

With respect to a heat-cured resin of the thermal stable resin composition in accordance with the present invention, the ²⁹Si-NMR chemical shift reveals absorption at from −40 ppm to −75 ppm. Of these, an integral value of the absorption at from −53 ppm to −75 ppm is larger than that of the absorption at from −40 ppm to −52 ppm. From this, it has been found that the organosilicon compound present in the resin has an Si—O—Si bond, thereby increasing the molecular weight.

According to the present invention, before mixing with the polyamic acid or polyamide-imide varnish using a solvent, the organosilicon compound of the general formula 4 is mixed with water to form a mixture, which is heat-treated for obtaining the desired thermal stable low elastic modulus material. On the other hand, when the mixture of the organosilicon compound and water is heat-treated in the polyamic acid or polyamide-imide varnish using a solvent, the polyamic acid or the polyamide-imide is hydrolyzed, and as a result, the thermal stable low elastic modulus material remarkably deteriorates in its elongation characteristics.

EXAMPLES

The thermal stable low elastic modulus material in accordance with the present invention is explained in detail as follows.

Example 1

In this Example, a first embodiment of the thermal stable low elastic modulus material in accordance with the present invention is explained. For the preparation thereof, 3-glycidoxypropyltrimethoxysilane and tin dibutyldilaurate are used as an organosilicon compound and a hydrolysis catalyst, respectively. Further, as the siloxane-containing polyamic acid, that obtained in N-methyl-2-pyrrolidone by mixing 3,3',4,4'-benzopheneone-tetracarboxylic acid anhydride, p-phenylenediamine and aminopropyl-terminal polydimethylsiloxane having a molecular weight of about 2000 with one another so as to make the amine and the acid anhydride equimolar is used. Incidentally, a siloxane content is found to be 40 wt %.

A process for producing the thermal stable low elastic modulus material in this Example is explained as follows.

(1) To 20 g of 3-glycidoxypropyltrimethoxysilane, 2 g of water and 0.2 g of tin dibutyllaurate are added, and the mixture is stirred, and thereafter allowed to stand for 1 day or more at room temperature.

(2) The mixed liquid of (1) is heat-treated at 100° C. for 2 hours, and thereafter subjected to deaeration in vacuo at room temperature for 1 hour, and successively additional deaeration in vacuo at 80° C. for 15 minutes.

(3) To 300 g of the above-mentioned N-methyl-2-pyrrolidone solution of the polyamic acid having a resin content of 28 wt %, the mixed liquid of (2) is added, and the resulting mixture is stirred.

(4) The varnish obtained in (3) is coated on a mould releasing polyester film using an applicator. After drying at 130° C. for 10 minutes, a dried product is peeled from the mould releasing film to obtain a thermal stable low elastic modulus material, which is fabricated so as to have a thickness of 30 μm.

(5) The thermal stable low elastic modulus material obtained in (4) is subjected to thermosetting at 180° C. for 30 minutes and further at 250° C. for 30 minutes in a nitrogen atmosphere, thereby obtaining a cured product of the thermal stable low elastic modulus material.

Successively, the thermal expansion, dynamic viscoelasticity and electric insulation of the thermal stable low elastic modulus material obtained in (5) are explained as follows. From the thermal stable low elastic modulus material, a specimen for physical property measurement use is prepared and used for measuring thermal expansion and dynamic viscoelasticity. Conditions for the measurement of thermal expansion are as follows. Apparatus: TMA-3000, manufactured by Shinku Rikou Ltd., speed of raising temperature: 2° C./min., distance between chucks: 20 mm, and load: 0.5 g. Conditions for the measurement of dynamic viscoelasticity are as follows. Apparatus: PVE Rheospectra Equipment, manufactured by Rheology Ltd., speed of raising temperature: 2° C./min., frequency: 10 Hz, distance between chucks: 20 mm, and displacement amplitude: 2 μm. For measuring the volume resistivity, a cured product of the thermal stable low elastic modulus material is formed in a thin film form having a thickness of 10 μm on an Al-vapor deposited Si-wafer according to a spin coat process, and an electrode having a diameter of 3 mm is formed on the thin film to obtain a specimen. The specimen obtained is arranged in a thermostat, and an electric current carried in the thin film is measured using R8340, manufactured by Advantest Ltd., thereby determining the volume resistivity.

Table 1 summarizes respective coefficients of thermal expansion and storage elastic moduli measured at −50° C. and 300° C., the electric insulation, the integral value of peaks according to $^{29}$Si-NMR chemical shift and the average number of the repeating unit of $SiRO_{3/2}$ given for $R^1$ to $R^6$ in the general formula 1.

TABLE 1

| | Example 1 | Comparative Example 1 | Example 2 | Comparative Example 2 | Example 3 | Comparative Example 3 |
|---|---|---|---|---|---|---|
| Polyamic acid | 3,3',4,4'-Benzophenone-tetracarboxylic acid anhydride/4,4'-diamino-diphenyl ether/aminopropyl-terminal polydimethylsiloxane 300 g | | 3,3',4,4'-Biphenyl-tricarboxylic acid anhydride monochloride/4,4'-diaminodiphenylmethane/aminopropyl-terminal polydimethylsiloxane 300 g | | Terephthalic acid/4,4'-diaminodiphenylmethane/aminopropyl-terminal polydimethylsiloxane 300 g | |
| Organosilicon compound | 3-Glycidoxy-trimethoxysilane 20 g | — | N-(2-Amino-ethyl) 3-aminopropyl tri-methoxysilane 20 g | — | 3-Glycidoxy-trimethoxy-silane 20 g | — |
| Amount of water added | 2.0 g | — | 2.0 g | — | 2.0 g | — |
| Heat-treatment temperature | 100° C. | — | 100° C. | — | 100° C. | — |
| Heat-treatment time | 2 h | — | 2 h | — | 2 h | — |
| Cofficient of thermal expansion at −50° C. (/K.) | $1.3 \times 10^{-4}$ | $1.3 \times 10^{-4}$ | $1.2 \times 10^{-4}$ | $1.2 \times 10^{-4}$ | $1.2 \times 10^{-4}$ | $1.2 \times 10^{-4}$ |
| Cofficient of thermal expansion at 300° C. (/K.) | $2.2 \times 10^{-4}$ | $4.7 \times 10^{-4}$ | $2.2 \times 10^{-4}$ | $4.5 \times 10^{-4}$ | $2.2 \times 10^{-4}$ | $5.0 \times 10^{-4}$ |
| Storage elastic modulus at −50° C. (MPa) | 800 | 700 | 700 | 600 | 1000 | 1000 |
| Storage elastic modulus at 300° C. (MPa) | 50 | 0.3 | 40 | 0.2 | 30 | 0.4 |
| Volume resistivity at 25° C. (Ωcm) | $2 \times 10^{16}$ | $2 \times 10^{16}$ | $1 \times 10^{16}$ | $1 \times 10^{16}$ | $1 \times 10^{16}$ | $1 \times 10^{16}$ |
| Volume resistivity at 200° C. (Ωcm) | $6 \times 10^{14}$ | $8 \times 10^{10}$ | $2 \times 10^{14}$ | $8 \times 10^{9}$ | $3 \times 10^{14}$ | $1 \times 10^{10}$ |
| Integral value ratio of Si-NMR | 9.4 | — | 5.8 | — | 9.4 | — |
| Average repeating units of ($SiRO_{3/2}$) given for $R^1$, $R^2$, $R^3$, $R^4$, $R^5$ and $R^6$ in general formula 1 | 1.4 | — | 0.8 | — | 1.4 | — |

With respect to the coefficient of thermal expansion of the thermal stable low elastic modulus material, increase of that measured at 300° C. compared with that measured at −50°

C. is suppressed to not more than 100%. From the result, it is demonstrated that thermal dimension stability is great within the above-described temperature range. With respect to the storage elastic modulus thereof, a proportion of that measured at 300° C. to that measured at −50° C. is suppressed to not more than one fiftieth. From the result, it is demonstrated that a change in the dynamic characteristics is little within the above-described temperature range. With respect to the volume resistivity thereof, a proportion of that of the low temperature region below the Tg to that of the high temperature region above the Tg is suppressed to not more than $10^2$. From the result, it is demonstrated that the thermal stable low elastic modulus material in this Example is superior in reliability of the electric insulation regardless of a temperature fluctuation.

While, the integral value of peaks of from −53 ppm to −72 ppm obtained according to a $^{29}$Si-NMR chemical shift of the thermal stable low elastic modulus material is 9.4 times that of peaks of from −40 ppm to −52 ppm obtained according thereto. From the result, the organosilicon compound has been found to be a molecule of an oligomer level.

Example 2

In this Example, a second embodiment of the thermal stable low elastic modulus material in accordance with the present invention is explained. For the preparation thereof, N-(2-aminoethyl)-3-aminopropyltrimethoxysilane and tin dibutyldilaurate are used as an organosilicon compound and a hydrolysis catalyst, respectively. Further, a siloxane-containing polyamide-imide obtained as follows is used. That is, 3,3',4-biphenyl-tricarboxylic acid anhydride chloride, 4,4'-diaminodiphenylmethane and aminopropyl-terminal polydimethylsiloxane having a molecular weight of about 4000 are mixed with one another, provided that the 3,3',4-biphenyl-tricarboxylic acid anhydride chloride is equimolar to a mixture of the 4,4'-diaminodiphenylmethane and the aminopropyl-terminal polydimethylsiloxane, thereby obtaining the siloxane-containing polyamide-imide in N,N-dimethylacetamide. Incidentally, a siloxane content is found to be 35 wt %.

A process for producing the thermal stable low elastic modulus material in this Example is explained as follows.

(1) To 20 g of N-(2-aminoethyl)-3-aminopropyltrimethoxysilane, 1 g of water and 0.2 g of tin dibutyldilaurate are added, and the mixture is stirred, and thereafter allowed to stand for 1 day or more at room temperature.

(2) The mixed liquid of (1) is heat-treated at 40° C. for 2 hours, and thereafter subjected to deaeration in vacuo at room temperature for 2 hours.

(3) To 300 g of the above-mentioned N,N-dimethylacetamide solution of the polyamic acid having a resin content of 28 wt %, the mixed liquid of (2) is added, and the mixture is stirred.

(4) The varnish obtained in (3) is coated on a mould releasing polyester film using an applicator. After drying at 130° C. for 10 minutes, a dried product is peeled from the mould releasing film to obtain a thermal stable low elastic modulus material, which is fabricated so as to have a thickness of 30 μm.

(5) The thermal stable low elastic modulus material obtained in (4) is subjected to thermosetting at 180° C. for 30 minutes and further at 250° C. for 30 minutes in a nitrogen atmosphere, thereby obtaining a cured product of the thermal stable low elastic modulus material.

Successively, the thermal expansion, dynamic viscoelasticity and electric insulation of the thermal stable low elastic modulus material obtained in (5) are explained as follows. From the thermal stable low elastic modulus material, a specimen for physical property measurement use is prepared and used for measuring thermal expansion and dynamic viscoelasticity. Conditions for the measurement of thermal expansion are as follows. Apparatus: TMA-3000, manufactured by Shinku Rikou Ltd., speed of raising temperature: 2° C./min., distance between chucks: 20 mm, and load: 0.5 g. Conditions for the measurement of dynamic viscoelasticity are as follows. Apparatus: PVE Rheospectra Equipment, manufactured by Rheology Ltd., speed of raising temperature: 2° C./min., frequency: 10 Hz, distance between chucks: 20 mm, and displacement amplitude: 2 μm. For measuring the volume resistivity, a cured product of the thermal stable low elastic modulus material is formed in a thin film form having a thickness of 10 μm on an Al-vapor deposited Si-wafer according to a spin coat process, and an electrode having a diameter of 3 mm is formed on the thin film to obtain a specimen. The specimen obtained is arranged in a thermostat, and an electric current carried in the thin film is measured using R8340, manufactured by Advantest Ltd., thereby determining the volume resistivity.

Table 1 summarizes respective coefficients of thermal expansion and storage elastic moduli at −50° C. and 300° C., the electric insulation, the integral value of peaks according to $^{29}$Si-NMR chemical shift and the average number of the repeating unit of $SiRO_{3/2}$ given for $R^1$ to $R^6$ in the general formula 1.

With respect to the coefficient of thermal expansion of the thermal stable low elastic modulus material, increase of that measured at 300° C. compared with that measured at −50° C. is suppressed to not more than 100%. From the result, it is demonstrated that thermal dimension stability is great within the above-described temperature range. With respect to the storage elastic modulus thereof, a proportion of that measured at 300° C. to that measured at −50° C. is suppressed to not more than one fiftieth. From the result, it is demonstrated that a change in the dynamic characteristics is little within the above-described temperature range. With respect to the volume resistivity thereof, a proportion of that of the low temperature region below the Tg to that of the high temperature region above the Tg is suppressed to not more than $10^2$. From the result, it is demonstrated that the thermal stable low elastic modulus material in this Example is superior in reliability of the electric insulation regardless of a temperature fluctuation.

While, the integral value of peaks of from −53 ppm to −72 ppm obtained according to a $^{29}$Si-NMR chemical shift of the thermal stable low elastic modulus material is 5.8 times that of peaks of from −40 ppm to −52 ppm obtained according thereto. From the result, the organosilicon compound has been found to be a molecule of an oligomer level.

Example 3

In this Example, a third embodiment of the thermal stable resin composition in accordance with the present invention is explained. For the preparation thereof, both of 3-glycidoxypropyltrimethoxysilane and 3-glycidoxypropyldimethoxysilane, and tin dibutyldilaurate are used as an organosilicon compound and a hydrolysis catalyst, respectively. Further, a polyamide obtained in N-methyl-2-pyrrolidone by mixing terephthalic acid, 4,4'-diaminodiphenylmethane and aminopropyl-terminal polydimethylsiloxane having an average molecular weight of about 4000 with one another so as to make the carboxylic acid and the amine equimolar is used.

A process for producing the thermal stable resin composition in this Example is explained as follows.

(1) To 20 g of 3-glycidoxypropyltrimethoxysilane, 2.0 g of water and 0.2 g of tin dibutyldilaurate are added, and the mixture is stirred, and thereafter allowed to stand for 1 day or more at room temperature.

(2) The mixed liquid of (1) is heat-treated at 100° C. for 2 hours, and thereafter subjected to deaeration in vacuo at room temperature for 1 hour and successively additional deaeration in vacuo at 80° C. for 15 minutes.

(3) To 300 g of the above-mentioned N-methyl-2-pyrrolidone solution of the polyamic acid having a resin content of 28 wt %, the mixed liquid of (2) is added, and the mixture is stirred.

(4) The varnish obtained in (3) is coated on a mould releasing polyester film using an applicator. After drying at 130° C. for 10 minutes, a dried product is peeled from the mould releasing film to obtain a thermal stable low elastic modulus material, which is fabricated so as to have a thickness of 30 μm.

(5) The thermal stable low elastic modulus material obtained in (4) is subjected to thermosetting at 180° C. for 30 minutes and further at 250° C. for 30 minutes in a nitrogen atmosphere, thereby obtaining a cured product of the thermal stable low elastic modulus material.

Successively, the thermal expansion, dynamic viscoelasticity and electric insulation of the thermal stable low elastic modulus material obtained in (5) are explained as follows. From the thermal stable low elastic modulus material, a specimen for physical property measurement use is prepared and used for measuring thermal expansion and dynamic viscoelasticity. Conditions for the measurement of thermal expansion are as follows. Apparatus: TMA-3000, manufactured by Shinku Rikou Ltd., speed of raising temperature: 2° C./min., distance between chucks: 20 mm, and load: 0.5 g. Conditions for the measurement of dynamic viscoelasticity are as follows. Apparatus: PVE Rheospectra Equipment, manufactured by Rheology Ltd., speed of raising temperature: 2° C./min., frequency: 10 Hz, distance between chucks: 20 mm, and displacement amplitude: 2 μm. For measuring the volume resistivity, a cured product of the thermal stable low elastic modulus material is formed in a thin film form having a thickness of 10 μm on an Al-vapor deposited Si-wafer according to a spin coat process, and an electrode having a diameter of 3 mm is formed on the thin film to obtain a specimen. The specimen obtained is arranged in a thermostat, and an electric current carried in the thin film is measured using R8340, manufactured by Advantest Ltd., thereby determining the volume resistivity.

Table 2 summarizes respective coefficients of thermal expansion and storage elastic moduli at −50° C. and 300° C., the electric insulation, the integral value of peaks according to $^{29}$Si-NMR chemical shift and the average number of the repeating unit of $SiRO_{3/2}$ given for $R^1$ to $R^6$ in the general formula 1.

With respect to the coefficient of thermal expansion of the thermal stable low elastic modulus material, increase of that measured at 300° C. compared with that measured at −50° C. is suppressed to not more than 100%. From the result, it is demonstrated that thermal dimension stability is great within the above-described temperature range. With respect to the storage elastic modulus thereof, a proportion of that measured at 300° C. to that measured at −50° C. is suppressed to not more than one fiftieth. From the result, it is demonstrated that a change in the dynamic characteristics is little within the above-described temperature range. With respect to the volume resistivity thereof, a proportion of that of the low temperature region below the Tg to that of the high temperature region above the Tg is suppressed to not more than $10^2$. From the result, it is demonstrated that the thermal stable low elastic modulus material in this Example is superior in reliability of the electric insulation regardless of a temperature fluctuation.

While, the integral value of peaks of from −53 ppm to −72 ppm obtained according to a $^{29}$Si-NMR chemical shift of the thermal stable low elastic modulus material is 9.4 times that of peaks of from −40 ppm to −52 ppm obtained according thereto. From the result, the organosilicon compound has been found to be a molecule of an oligomer level.

In conclusion, the thermal stable low elastic modulus materials obtained in the above Examples 1 to 3 are little in change in the elastic modulus and coefficient of thermal expansion within a temperature range of from −50° C. to 300° C., and the volume resistivity, and therefore superior in their dynamical characteristics to heat, thermal dimensional stability and electric insulation stability.

As a result, generation of thermal stress is little when the thermal stable low elastic modulus materials are used for relaxing stress generated between bare chip and bare chip, bare chip and metal material, bare chip and organic material, bare chip and inorganic material, metal material and organic material, metal material and inorganic material, and organic material and inorganic material in semiconductor fields. Therefore, almost no peel occurs at the interface of the bare chip. In addition, the thermal stable low elastic modulus materials exhibit no deterioration in their electrical characteristics, particularly in their electric insulation. Accordingly, the thermal stable low elastic modulus material in accordance with the present invention is a material the most suitable for the flip chip packaging, in which a high reliability is needed.

Comparative Examples 1, 2 and 3

In Comparative Example 1, there is used a siloxane-containing polyamic acid, which is synthesized in N-methyl-2-pyrrolidone by mixing 3,3',4,4'-benzopheneone-tetracarboxylic acid dianhydride, p-phenylenediamine and aminopropyl-terminal polydimethylsiloxane having a molecular weight of about 2000 with one another so as to make the amine and the acid anhydride equimolar. A siloxane content is 40 wt %. In Comparative Example 2, there is used a siloxane-containing polyamide-imide. The polyamide-imide is synthesized in N,N-dimethylacetamide by mixing 3,3',4-biphenyl-tricarboxylic acid anhydride chloride, 4,4'-diaminodiphenylmethane and aminopropyl-terminal polydimethylsiloxane having a molecular weight of about 4000 with one another, provided that the 3,3',4-biphenyl-tricarboxylic acid anhydride chloride is equimolar to a mixture of the 4,4'-diaminodiphenylmethane and the aminopropyl-terminal polydimethylsiloxane. A siloxane content is 35 wt %. In Comparative Example 3, there is used a polyamide synthesized in N-methyl-2-pyrrolidone by mixing terephthalic acid, 4,4'-diaminodiphenylmethane and aminopropyl-terminal polydimethylsiloxane having an average molecular weight of about 4000 with one another so as to make the carboxylic acid and the amine equimolar.

A process for producing each low elastic modulus material of Comparative Example 1 to 3 is explained as follows.

(1) The above-mentioned polyamic acid varnish or polyamide-imide varnish having a resin content of 28 wt % is coated on a mould releasing polyester film using an applicator. After drying at 130° C. for 10 minutes, a dried product is peeled from the mould releasing film to obtain a low elastic modulus material, which is fabricated so as to have a thickness of 30 μm.

(2) The low elastic modulus material obtained in (1) is subjected to thermosetting at 180° C. for 30 minutes and further at 250° C. for 30 minutes in a nitrogen atmosphere, thereby obtaining a cured product of the low elastic modulus material.

According to a manner similar to that of Example 1, the thermal expansion, dynamic viscoelasticity and electric insulation thereof are measured. Respective coefficients of thermal expansion and storage elastic moduli measured at −50° C. and 300° C. are as shown in Table 1. With respect to the comparative materials of Comparative Examples 1 to 3, the coefficient of thermal expansion measured at a high temperature of 300° C. is not less than three times that measured at −50° C. From the result, it is demonstrated that the materials are poor in their thermal dimensional stability within the above-mentioned temperature range. From the storage elastic modulus, whose value is not more than one thousandth, it is demonstrated that a change in the dynamical characteristics is great at a high temperature and a change in the dynamical characteristics is great within the above-mentioned temperature range. With respect to the volume resistivity, difference between the volume resistivity at the low temperature region below the Tg and that at the high temperature region above the Tg is as great as not less than $10^5$.

From the above results, the thermal stable low elastic modulus materials of Examples 1 to 3 are superior in reliability within a temperature range of from −50° C. to 300° C. as a stress relaxing material for bare chip packaging use to the comparative materials of Comparative Examples 1 to 3.

Example 4

FIG. 1 shows an embodiment of a process for producing a semiconductor device using the thermal stable low elastic modulus material in accordance with the present invention as a stress relaxing layer. The thermal stable low elastic modulus material used in this Example is obtained in the following manner.

3-Glycidoxypropyltrimethoxysilane and tin dibutyldilaurate are used as an organosilicon compound and a hydrolysis catalyst, respectively. Further, as a siloxane-containing polyamic acid, that obtained in N-methyl-2-pyrrolidone by mixing 3,3',4,4'-benzopheneonetetracarboxylic acid anhydride, p-phenylenediamine and aminopropyl-terminal polydimethylsiloxane having a molecular weight of about 2000 with one another so as to make the amine and the acid anhydride equimolar, is used. A siloxane content is 40 wt %.

A process for producing a varnish of the thermal stable low elastic modulus material in this Example is explained as follows.

(1) To 20 g of 3-glycidoxypropyltrimethoxysilane, 2 g of water and 0.2 g of tin dibutyldilaurate are added, and the mixture is stirred, and thereafter allowed to stand for 1 day or more at room temperature.

(2) The mixed liquid of (1) is heat-treated at 100° C. for 2 hours, and thereafter subjected to deaeration in vacuo at room temperature for 1 hour, and successively additional deaeration in vacuo at 80° C. for 15 minutes.

(3) To 300 g of the above-mentioned N-methyl-2-pyrrolidone solution of the polyamic acid having a resin content of 28 wt %, the mixed liquid of (2) is added, and the mixture is stirred.

Figure 4:
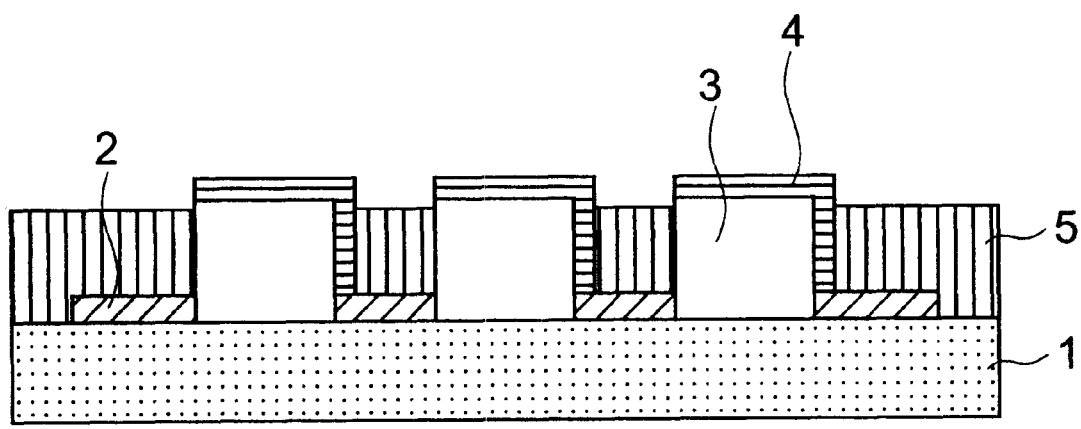
FIG. 4 is a sectional view of that obtained by applying an encapsulation step to that of FIG. 3.
Figure 5:
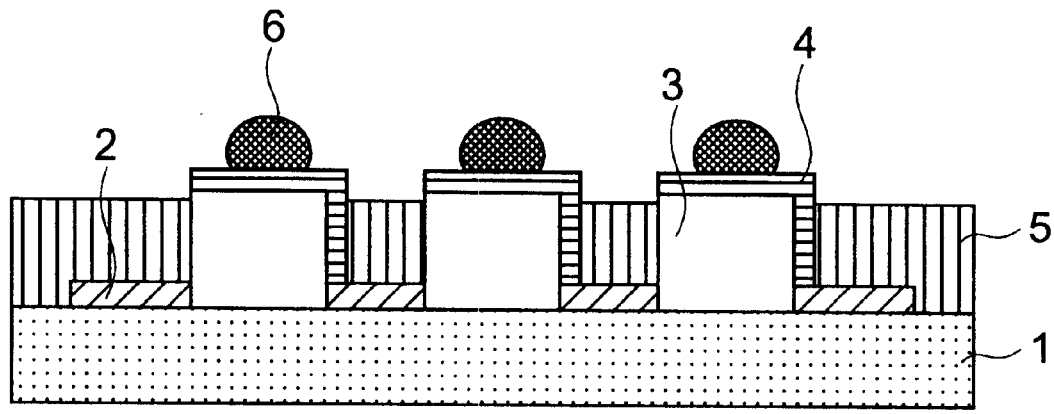
FIG. 5 is a sectional view of that obtained by forming a ball bump on that of FIG. 4.

The thermal stable low elastic modulus material in accordance with the present invention is coated on the whole surface of a semiconductor-formed wafer 1 according to a screen printing process. After completion of the coating, the solvent is evaporated to form a film having a thickness of 150 μm. Using a carbon dioxide gas laser, a blind via hall is formed at a pre-determined position, and a stress relaxing layer 3 as shown in FIG. 2 is formed there. At this time, a pad 2 on the wafer is exposed. Successively, a conductor layer having a thickness of 10 μm is formed on the whole surface of the semiconductor wafer and the stress relaxing layer using an electroless copper plating liquid. For patterning the conductor, an electrodeposition resist having a thickness of 5 μm is formed thereon, and a pre-determined portion is exposed to UV through a mask, thereby causing cross-linking reaction of said portion. Successively, patterning is performed using an alkali developer, an unnecessary portion of the copper is removed with an etching liquid, and further the remaining resist is removed to form a conductor 4 as shown in FIG. 3. Successively, the pad on the semiconductor wafer is formed by means of plating, and thereafter, an encapsulating epoxy liquid resin 5 is filled as shown in FIG. 4 according to a screen printing process, thereby protecting the welding portion of the conductor from an external environment. In this regard, when a non-solvent liquid resin is used, it is possible to obtain a good encapsulation without any film reduction after hardening the resin. Successively, for the purpose of facilitating an electric connection between the exposed portion of the conductor and a packaging board, a ball-like bump (solder ball 6) as shown in FIG. 5 is formed by means of solder ball transfer and reflow. Incidentally, a pitch of the pad is 0.5 mm, and a size of the solder ball is 0.2 mm. Finally, the wafer is cut into 14 mm squares, thereby obtaining the desired semiconductor device.

Figure 6:
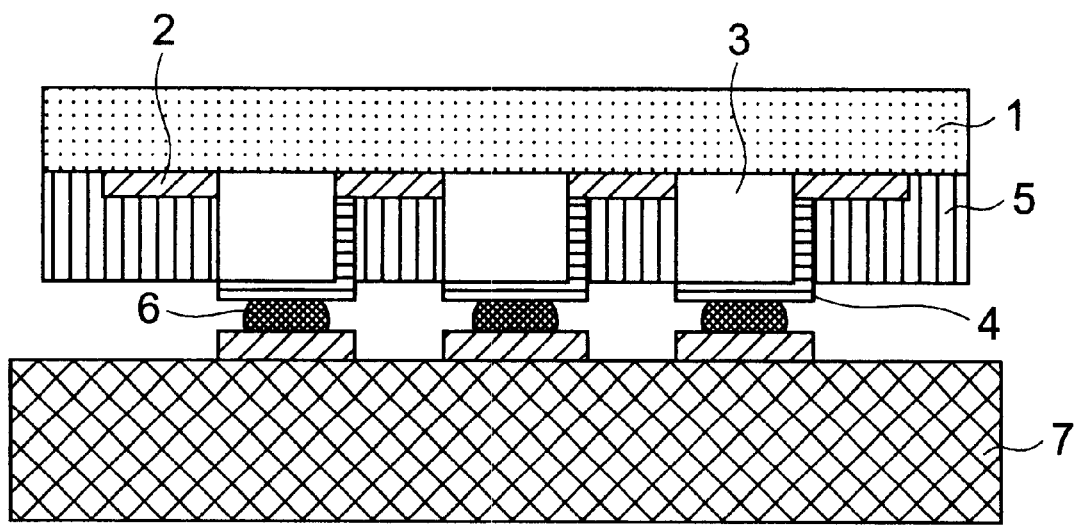
FIG. 6 is a sectional view of that obtained by electrically connecting the semiconductor device of FIG. 5 with a printed board.

A circuit board 7 (FR 4 board) as shown in FIG. 6, on which pads and circuits are formed and a flux is printed on each pad, is used. The pad on said circuit board and the solder ball on said semiconductor device are positioned with each other, and thereafter, the semiconductor device is temporarily fixed. The circuit board is placed in a solder reflow furnace for a predetermined period of time, and then electric connection is conducted between the pads. Incidentally, a bump height is 120 μm.

Successively, a thermal cycle test is carried out in relation to the semiconductor device after conducting electric connection to FR 4 board. The thermal cycle test is carried out 1000 times under conditions of −55° C. and 150° C. As a result of the test for 10 samples, there has been observed no defect of solder connection.

In conclusion, during the thermal cycle test, no stress concentrates on the solder ball, and no fatigue fracture of the solder ball occurs. From this result, it is clear that the thermal stable low elastic modulus material in accordance with the present invention is superior in relaxation of stress generated between the bare chip and the organic material board. Thus, the thermal stable low elastic modulus material in accordance with the present invention is the most suitable as a stress relaxing material for the flip chip packaging.

Comparative Example 4

In a manner similar to that of Example 4, a semiconductor device is fabricated and similarly electric connection to FR 4 board is carried out. As a stress relaxing material, a siloxane-containing polyamic acid, which is synthesized in N-methyl-2-pyrrolidone by mixing 3,3',4,4'- benzopheneonetetracarboxylic acid dianhydride, p-phenylenediamine and aminopropyl-terminal polydimethylsiloxane having a molecular weight of about 2000 with one another so as to make the amine and the acid anhydride equimolar, is used. A siloxane content is 40 wt %.

Successively, a thermal cycle test is carried out in relation to the semiconductor device after conducting electric connection to FR 4 board.

As a result of the test for 10 samples, all of 10 samples have a defect of solder connection in the neighborhood of the chips and a peel at the interface between the chip and the stress relaxing material.

In conclusion, during the thermal cycle test, stress concentrates on the solder ball in the neighborhood of the chips, and fatigue fracture of the solder ball occurs, and moreover peel occurs owing to deterioration of adhesion at the interface between the chip and the stress relaxing material. From the result, it is demonstrated as follows. In order to relax the stress generated between the bare chip and the organic material board, it is important to diminish change in physical properties of the thermal stable low elastic modulus material within a range of temperature, at which the thermal cycle test is carried out.

The thermal stable low elastic modulus material in accordance with the present Examples contains an $SiO_2$ skeleton, which is stable from a viewpoint of dynamical characteristics. For this reason, it is little in change in its physical properties such as coefficient of thermal expansion and elastic modulus, it is also little in change in its adhesion strength and electric insulation, and it is high in its thermal stability, regardless of a temperature fluctuation. Thus, the thermal stable low elastic modulus material in accordance with the present invention can be used to be placed between bare chip and bare chip, bare chip and metal material, bare chip and organic material, bare chip and inorganic material, metal material and organic material, metal material and inorganic material, and organic material and inorganic material in semiconductor fields. Thereby, the stress generated at the interface owing to a temperature fluctuation can be relaxed, and reliability of electric insulation at the interface is high regardless of a temperature fluctuation.

It should be further understood by those skilled in the art that the foregoing description has been made on embodiments of the invention and that various changes and modifications may be made in the invention without departing from the spirit of the invention and the scope of the appended claims.

Effects of the Invention

According to the present invention, there is provided a thermal stable low elastic modulus material, which is possessed of thermal stability of not less than 300° C., capable of relaxing the stress generated between bare chip and bare chip, bare chip and metal material, bare chip and organic material, bare chip and inorganic material, metal material and organic material, metal material and inorganic material, and organic material and inorganic material in semiconductor fields, and high in electric reliability.

What is claimed is:

1. A thermally stable low elastic modulus resin composition comprising a resin or resin precursor and an organosilicon compound represented by the following general formula 1, 2 or 3, wherein the resin contains at least one resin selected from the group consisting of polyimides, polyamide-imides and polyamides, and an elastic modulus measured at −50° C. of a cured product of the resin composition is from 2 to 0.01 GPa,

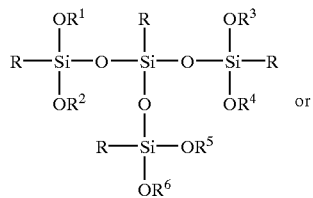
General formula 1

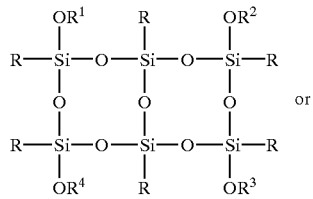
General formula 2

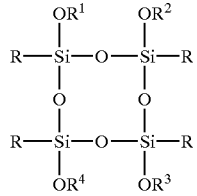
General formula 3 wherein R is an organic group capable of forming a covalent bond with the polyimide, polyamide-imide or polyamide, and $R^1$ to $R^6$ are independently of one or another of a silicon-containing group having 0 to 10 repeating units of $SiRO_{3/2}$, provided that when a number of the repeating unit is 0, $R^1$ to $R^6$ are independently of one or another of H, $CH_3$ or $C_2H_5$.

2. The thermally stable low elastic modulus resin composition according to claim 1, wherein an integral value of peaks of from −53 ppm to −72 ppm obtained according to a $^{29}Si$-NMR chemical shift of the organosilicon compound is from 1 to 30 times that of peaks of from −40 ppm to −52 ppm obtained according thereto.

3. A thermally stable low elastic modulus material obtained by heat-curing a mixture comprising a resin or resin precursor and an organosilicon compound represented by the following general formula 1, 2 of 3, wherein the resin contains at least one resin selected from the group consisting of polyimides, polyamides-imides and polyamides, and an elastic modulus measured at −50° C. of a cured product of the mixture is from 2 to 0.01 GPa,

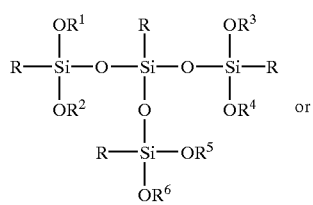
General formula 1

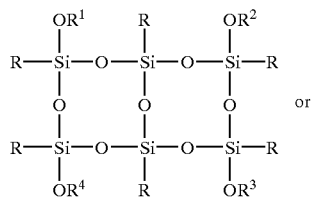
General formula 2

General formula 3

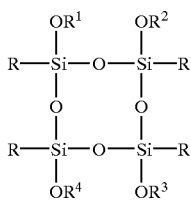

wherein R is an organic group capable of forming a covalent bond with the polyimide, polyamide-imide or polyamide, and $R^1$ to $R^6$ are independently of one or another of a silicon-containing group having 1 to 10 repeating units of $SiRO_{3/2}$, provided that when a number of the repeating units is 0, $R^1$ to $R^6$ are independently of one or another of H, $CH_3$ or $C_2H_5$.

4. The thermally stable low elastic modulus material according to claim 3, wherein the elastic modulus measured at −50° C. is not more than 50 times that measured at 300° C., and a coefficient of thermal expansion measured at −50° C. of the cured product is not less than 0.5 times that measured at 300° C.

5. A resin precursor varnish composition comprising a resin or resin precursor and an organosilicon compound represented by the following general formula 1, 2 or 3, wherein the varnish composition exhibits an elastic modulus measured at −50° C. of from 2 to 0.01 GPa, when cured, and the resin contains at least one resin selected from the group consisting of polyimides, polyamide-imides and polyamides, General formula 1

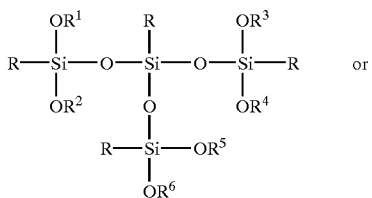

General formula 2

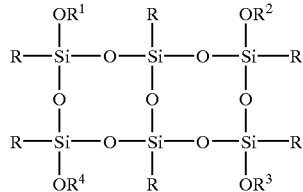

or

General formula 3

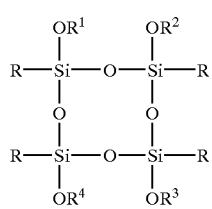

wherein R is an organic group capable of forming a covalent bond with the polyimide, polyamide-imide or polyamide, and $R^1$ to $R^6$ are independently of one or another of a silicon-containing group having 0 to 10 repeating units of $SiRO_{3/2}$, provided that when a number of the repeating unit is 0, $R^1$ to $R^6$ are independently of one or another of H, $CH_3$ or $C_2H_5$.

6. The resin precursor varnish composition comprising a resin or resin precursor containing at least one resin selected from the group consisting of polyimides, polyamide-imides and polyamides according to claim 5, wherein the elastic modulus measured at −50° C. is not more than 50 times that measured at 300° C., and a coefficient of thermal expansion measured at −50° C. of the cured varnish composition is not less than 0.5 times that measured at 300° C.

* * * * *